United States Patent
Hur et al.

(10) Patent No.: US 9,502,531 B2
(45) Date of Patent: Nov. 22, 2016

(54) SEMICONDUCTOR DEVICE HAVING FIN-TYPE FIELD EFFECT TRANSISTOR AND METHOD OF MANUFACTURING THE SAME

(71) Applicant: Samsung Electronics Co., Ltd., Suwon-si, Gyeonggi-do (KR)

(72) Inventors: Sung Gi Hur, Hwaseong-si (KR); TaeYong Kwon, Suwon-si (KR); Sangsu Kim, Yongin-si (KR); Jungdal Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/165,931

(22) Filed: May 26, 2016

(65) Prior Publication Data

US 2016/0268394 A1    Sep. 15, 2016

Related U.S. Application Data

(63) Continuation of application No. 14/668,490, filed on Mar. 25, 2015, now Pat. No. 9,379,244.

(30) Foreign Application Priority Data

Apr. 25, 2014    (KR) .................. 10-2014-0050172

(51) Int. Cl.
*H01L 21/8238*    (2006.01)
*H01L 21/84*    (2006.01)
(Continued)

(52) U.S. Cl.
CPC ... *H01L 29/66553* (2013.01); *H01L 21/02532* (2013.01); *H01L 21/76224* (2013.01); *H01L 29/66795* (2013.01)

(58) Field of Classification Search
CPC ... H01L 29/04; H01L 29/78; H01L 29/7849; H01L 29/0886; H01L 29/66553; H01L 29/66795; H01L 27/0883; H01L 27/092; H01L 23/3171
USPC ........ 257/190, 347, 351, 369, 392, E27.062, 257/E27.112, E21.632, E21.704; 438/151, 438/154, 191
See application file for complete search history.

(56) References Cited

U.S. PATENT DOCUMENTS 7,538,390 B2    5/2009    Wang et al.
8,008,751 B2    8/2011    Irisawa et al.
(Continued)

FOREIGN PATENT DOCUMENTS

JP    2003-303971    10/2003

OTHER PUBLICATIONS

Krishnamohan et al., "Comparison of (001), (110) and (111) Uni-axial- and Biaxial- Strained-Ge and Strained-Si PMOS DGFETs for All Channel orientations: Mobility Enhancement, Drive Current, Delay and Off-State Leakage", 2008 IEEE International Electron Devices Meeting, IEEE International, Dec. 15-17, 2008, 4 pages.

(Continued)

*Primary Examiner* — Dao H Nguyen
(74) *Attorney, Agent, or Firm* — Myers Bigel, P.A.

(57) ABSTRACT

A semiconductor device includes a substrate having a first region and a second region, a first MOS transistor including a first fin structure and a first gate electrode in the first region, the first fin structure having a first buffer pattern, a second buffer pattern, and a first channel pattern which are sequentially stacked on the substrate, and a second MOS transistor including a second fin structure and a second gate electrode in the second region, the second fin structure having a third buffer pattern and a second channel pattern which are sequentially stacked on the substrate. Related fabrication methods are also discussed.

6 Claims, 15 Drawing Sheets

(51) Int. Cl.
　　*H01L 27/12* (2006.01)
　　*H01L 29/04* (2006.01)
　　*H01L 29/66* (2006.01)
　　*H01L 21/762* (2006.01)
　　*H01L 21/02* (2006.01)

(56) References Cited

U.S. PATENT DOCUMENTS

| | | |
|---|---|---|
| 8,053,301 B2 | 11/2011 | Jaeger et al. |
| 8,486,770 B1 | 7/2013 | Wu et al. |
| 8,618,556 B2 | 12/2013 | Wu et al. |
| 9,123,566 B2 | 9/2015 | Mitard et al. |
| 2007/0221956 A1 | 9/2007 | Inaba |
| 2013/0168771 A1* | 7/2013 | Wu ............... H01L 27/1211 257/351 |
| 2014/0367741 A1 | 12/2014 | Yang et al. |
| 2015/0097239 A1* | 4/2015 | Chen ............... H01L 23/3171 257/347 |
| 2016/0020109 A1* | 1/2016 | Yoo ............... H01L 21/3085 438/275 |
| 2016/0225676 A1* | 8/2016 | Jacob ............... H01L 21/845 |
| 2016/0233298 A1* | 8/2016 | Webb ............... H01L 23/535 |
| 2016/0240629 A1* | 8/2016 | Liou ............... H01L 29/66545 |

OTHER PUBLICATIONS

Lee et al., "Strained Si, SiGe, and Ge channels for high-mobility metal-oxide-semiconductor field-effect transistors", Journal of Applied Physics, vol. 97, Dec. 9, 2004, 28 pages.

Yang et al., "Electron mobility enhancement in strained-germanium n-channel metal oxide-semiconductor field-effect transistors", Applied Physics Letter, vol. 91, Sep. 4, 2007, 4 pages.

Yang et al., "Hybrid-Orientation Technology (HOT): Opportunities and Challenges", IEEE Transactions on Electron Devices, vol. 53, No. 5, May 2006, pp. 965-978 (14 pages).

\* cited by examiner

SEMICONDUCTOR DEVICE HAVING FIN-TYPE FIELD EFFECT TRANSISTOR AND METHOD OF MANUFACTURING THE SAME

CROSS-REFERENCE TO RELATED APPLICATIONS

The present application is a continuation application of and claims priority from U.S. patent application Ser. No. 14/668,490 filed on Mar. 25, 2015, which claims priority under 35 U.S.C. §119 to Korean Patent Application No. 10-2014-0050172 filed on Apr. 25, 2014 in the Korean Intellectual Property Office (KIPO), the contents of which are herein incorporated by reference in their entirety.

FIELD

The present inventive concepts relate to semiconductor devices having a fin-type field effect transistor (FinFET), and methods of manufacturing the same.

BACKGROUND

As feature sizes of semiconductor devices have become narrower, high leakage current due to short-channel effects may deteriorate reliability and performance of the semiconductor devices. In order to produce high performance devices having high reliability, various methods are being studied, for example, forming fin-type field effect transistors (FinFETs) to decrease short-channel effect and/or forming strained channels in the semiconductor devices to increase carrier (electron or hole) mobility.

SUMMARY

Aspects of the present inventive concepts provide semiconductor devices having a fin-type field effect transistor (FinFET), and methods of manufacturing the same.

According to some embodiments, a semiconductor device includes a substrate having first and second side-by-side regions, and first and second metal-oxide-semiconductor (MOS) transistors comprising first and second fin structures on the first and second regions of the substrate, respectively. The first fin structure includes a first buffer pattern, a second buffer pattern having a different lattice constant than the first buffer pattern, and a first channel pattern sequentially stacked on the first region. The second fin structure includes a third buffer pattern having a different lattice constant than the second buffer pattern, and a second channel pattern sequentially stacked on the second region. The first and second channel patterns and the first, second and third buffer patterns comprise a same semiconductor material.

In some embodiments, the first and second channel patterns and the first, second and third buffer patterns may be epitaxial layers.

In some embodiments, the semiconductor material may be germanium (Ge). A germanium concentration of the second channel pattern may be greater than that of the first and third buffer patterns.

In some embodiments, a difference between the lattice constant of the second buffer pattern and that of the first channel pattern at an interface therebetween may be less than a difference between the lattice constant of the third buffer layer and that of the second channel pattern at an interface therebetween.

In some embodiments, the lattice constant the third buffer pattern may be less than that of the second channel pattern at an interface therebetween such that the second channel pattern defines a compressively-strained channel region of the second MOS transistor.

In some embodiments, the lattice constant of the second buffer pattern may be the same as that of the first channel pattern at an interface therebetween such that the first channel pattern defines a strain-relaxed channel region of the first MOS transistor.

In some embodiments, the lattice constant of the second buffer pattern may be graded between the interface with the first channel pattern and an interface with the first buffer pattern.

In some embodiments, the first buffer pattern and the third buffer pattern may be portions of a same layer having a uniform lattice constant throughout.

In some embodiments, an effective channel width of the strain-relaxed channel region of the first MOS transistor may be greater than that of the strained channel region of the second MOS transistor.

In some embodiments, the third buffer pattern extends from the substrate beyond the first buffer pattern.

In some embodiments, sidewalls of the first or second channel pattern may have a (110) or (111) crystal orientation.

In some embodiments, a first source/drain electrode may be provided on the first channel pattern, and may include a semiconductor material having a smaller lattice constant than the first channel pattern to induce tensile strain therein. A second source/drain electrode may be provided on the second channel pattern, and may include a semiconductor material having a larger lattice constant than the second channel pattern to induce compressive strain therein.

According to further embodiments, a method of fabricating a semiconductor device includes forming respective first semiconductor buffer patterns on first and second regions of a substrate, forming a second semiconductor buffer pattern stacked on the first buffer pattern on the first region, and forming first and second semiconductor channel patterns stacked on the first buffer patterns in the first and second regions, respectively. The first and second semiconductor channel patterns define channel regions of first and second metal-oxide-semiconductor (MOS) transistors of different conductivity types, respectively. The second buffer pattern includes a different lattice constant than that of the first buffer patterns.

In some embodiments, the semiconductor device includes a substrate having a first region and a second region, a first MOS transistor including a first fin structure and a first gate electrode in the first region, the first fin structure having a first buffer pattern, a second buffer pattern, and a first channel pattern which are sequentially stacked on the substrate, and a second MOS transistor including a second fin structure and a second gate electrode in the second region, the second fin structure having a third buffer pattern and a second channel pattern which are sequentially stacked on the substrate. The first and third buffer patterns comprises a first semiconductor layer including germanium (Ge), the first channel pattern may include a second semiconductor layer including germanium (Ge), and the second channel pattern comprises a third semiconductor layer including germanium (Ge). The germanium (Ge) concentration of the first semiconductor layer may be less than the germanium (Ge) concentrations of the second and third semiconductor layers.

In some embodiments, the second buffer pattern may include a fourth semiconductor layer including germanium (Ge). A difference of the germanium (Ge) concentrations between the first channel pattern and an upper portion of the second buffer pattern may be less than a difference of the germanium (Ge) concentrations between the second channel pattern and an upper portion of the third buffer pattern.

In some embodiments, the second buffer pattern may include a semiconductor material including germanium (Ge), a germanium (Ge) concentration of the second buffer pattern being progressively increasing from the bottom portion of the second buffer pattern to the upper portion of the second buffer pattern. The first semiconductor layer may have a first germanium (Ge) concentration, and the first germanium (Ge) concentration may be substantially the same as the germanium (Ge) concentration of the bottom portion of the second buffer pattern. The second semiconductor layer may have a second germanium (Ge) concentration, and the second germanium (Ge) concentration may be substantially the same as the germanium (Ge) concentration of the upper portion of the second buffer pattern.

In some embodiments, the first semiconductor layer may have a first germanium (Ge) concentration, and the first germanium (Ge) concentration may be substantially constant in the first semiconductor layer. The third semiconductor layer may have a second germanium (Ge) concentration greater than the first germanium (Ge) concentration.

In some embodiments, the first semiconductor layer may comprise $Si_{1-x}Ge_x$ (0<x<1). The second semiconductor layer may comprise $Si_{1-y}Ge_y$ (x≤y≤1). The third semiconductor layer may comprise $Si_{1-a}Ge_a$ (x<a≤1).

In some embodiments, the upper surface of the first buffer pattern may have a lower level than the upper surface of the third buffer pattern.

In some embodiments, the upper surface of the first channel pattern may have a substantially same level as the upper surface of the second channel pattern from the substrate, and the upper surface of the second buffer pattern may have a substantially same level as the upper surface of the third buffer pattern from the substrate.

In some embodiments, the upper surface of the first channel pattern may have a substantially same level as the upper surface of the second channel pattern from the substrate, and the upper surface of the second buffer pattern may have a lower level than the upper surface of the third buffer pattern from the substrate.

In some embodiments, the substrate may include a single crystal silicon. The first and second channel patterns may comprise an epitaxial layer having upper surfaces parallel to the upper surface of the substrate and sidewalls substantially perpendicular to the upper surface of the substrate, and the sidewalls of the first and second channel pattern may have a (110) or (111) crystal orientation.

In some embodiments, the semiconductor device may include a substrate having a first region and a second region, a first MOS transistor including a first fin structure and a first gate electrode in the first region, the first fin structure having a first buffer pattern, a second buffer pattern, and a first channel pattern which are sequentially stacked on the substrate, and a second MOS transistor including a second fin structure and a second gate electrode in the second region, the second fin structure having a third buffer pattern and a second channel pattern which are sequentially stacked on the substrate. The first and second channel patterns may comprise a semiconductor material including germanium (Ge), and a difference of the lattice constants between the first channel pattern and an upper portion of the second buffer pattern may be less than a difference of lattice constants between the second channel pattern and an upper portion of the third buffer pattern.

In some embodiments, the first buffer pattern and the third buffer pattern may comprise substantially the same semiconductor material, and the first buffer pattern and the third buffer pattern may have a lattice constant greater than that of the substrate.

In some embodiments, the upper surface of the first buffer pattern may have a lower level than the upper surface of the third buffer pattern from the substrate.

In some embodiments, the first and third buffer patterns may comprise silicon germanium (SiGe), and germanium concentrations of the first and third buffer patterns may be less than germanium concentrations of the first or second channel patterns, respectively.

In some embodiments, the first buffer pattern, the second buffer pattern, and the first channel pattern may comprise silicon germanium (SiGe). A germanium (Ge) concentration of the second buffer pattern may be progressively increasing from the bottom portion of the second buffer pattern to the upper portion of the second buffer pattern. The first buffer pattern may have a first uniform germanium (Ge) concentration. The first uniform germanium (Ge) concentration may be substantially the same as the germanium (Ge) concentration of the bottom portion of the second buffer pattern.

In some embodiments, the first channel pattern may have a second uniform germanium (Ge) concentration. The second uniform germanium (Ge) concentration may be substantially the same as the germanium (Ge) concentration of the upper portion of the second buffer pattern.

In some embodiments, the third buffer pattern and the second channel pattern may comprise silicon germanium (SiGe). The third buffer pattern may have a first uniform germanium (Ge) concentration and the second channel pattern may have a second uniform germanium (Ge) concentration. The second uniform germanium (Ge) concentration may be greater than the first uniform germanium (Ge) concentration.

In some embodiments, a method of manufacturing a semiconductor device may include providing a substrate having a first region and a second region, forming a plurality of first fin structures on the substrate, the plurality of first fin structures including a first buffer pattern and a first channel pattern, forming a device isolation pattern filling a plurality of gaps between the plurality of first fin structures, forming a plurality of trenches in the device isolation pattern formed in the second region by removing upper portions of the first fin structures, the plurality of trenches exposing the first buffer pattern formed in the second region, and forming a plurality of second fin structures on the first buffer pattern formed in the second region, the plurality of second fin structures including a second buffer pattern and a second channel pattern. The first and second buffer patterns and the first and second channel patterns may comprise semiconductor material including germanium (Ge).

In some embodiments, the upper surface of the first buffer pattern formed in the second region may have a lower level than the upper surface of the first buffer pattern formed in the first region.

In some embodiments, the plurality of first fin structures further may comprise a third buffer pattern between the first buffer pattern and the first channel pattern. The third buffer pattern may comprise semiconductor material including germanium (Ge), and a germanium (Ge) concentration of the third buffer pattern may be progressively increasing from the bottom portion of the third buffer pattern to the upper portion of the third buffer pattern.

In some embodiments, a difference of the germanium (Ge) concentrations between the first channel pattern and an upper portion of the third buffer pattern may be less than a difference of the germanium (Ge) concentrations between the second channel pattern and an upper portion of the second buffer pattern.

In some embodiments, the second buffer pattern may comprise semiconductor material including germanium (Ge), and a germanium (Ge) concentration of the second buffer pattern may be progressively increasing from the bottom portion of the second buffer pattern to the upper portion of the second buffer pattern.

In some embodiments, a difference of the germanium (Ge) concentrations between the second channel pattern and an upper portion of the second buffer pattern may be less than a difference of the germanium (Ge) concentrations between the first channel pattern and an upper portion of the first buffer pattern.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION

Figure 1:
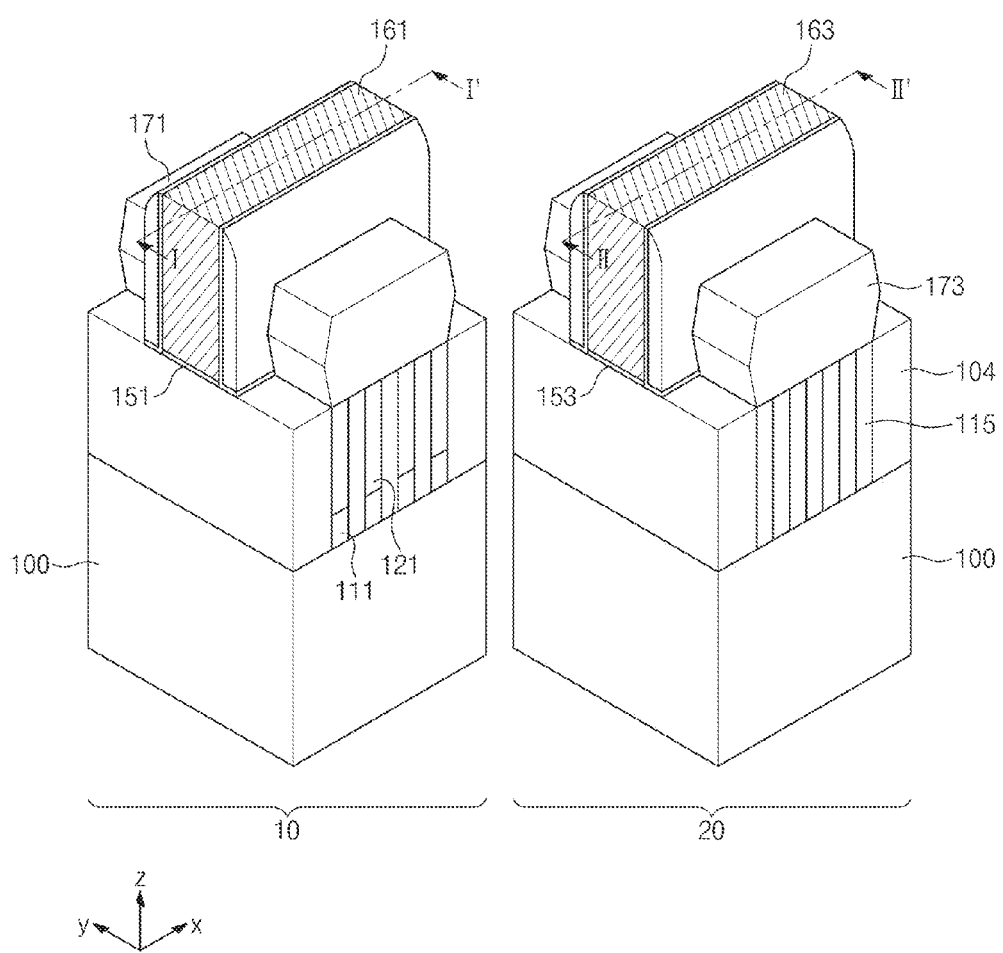
FIG. 1 is a plurality of perspective views illustrating semiconductor devices according to some embodiments of the inventive concepts.

Exemplary embodiments of the inventive concepts will now be described more fully hereinafter with reference to the accompanying drawings; however, they may be embodied in different forms and should not be construed as limited to the exemplary embodiments set forth herein.

It will be understood that when an element is referred to as being "on," "connected" or "coupled" to another element, it can be directly on, connected or coupled to the other element or intervening elements may be present. In contrast, when an element is referred to as "contacting," or being "directly on," "directly connected" or "directly coupled" to another element, there are no intervening elements present. Other words used to describe the relationship between elements or layers should be interpreted in a like fashion (e.g., "between" versus "directly between," "adjacent" versus "directly adjacent," "under" versus "directly under").

It will be understood that, although the terms "first", "second", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of example embodiments.

In the figures, the dimensions of layers and regions may be exaggerated for clarity of illustration.

Spatially relative terms, e.g., "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the term "and/or" includes any and all combinations of one or more of the associated listed items. The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art. It is noted that the use of any and all examples, or exemplary terms provided herein is intended merely to better highlight the example embodiments and is not a limitation on the scope of the inventive concepts unless otherwise specified.

Example embodiments will be described with reference to perspective views, cross-sectional views, and/or plan views. The profile of an example view may be modified according to, e.g., manufacturing techniques and/or allowances. Accordingly, the example embodiments are not intended to limit the scope, but cover all changes and modifications that can be caused due to, e.g., a change in manufacturing process. Thus, regions shown in the drawings are illustrated in schematic form and the shapes of the region are presented simply by way of illustration and not as a limitation.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, exemplary embodiments of the inventive concepts will be described in detail with reference to the accompanying drawings.

Figure 2:
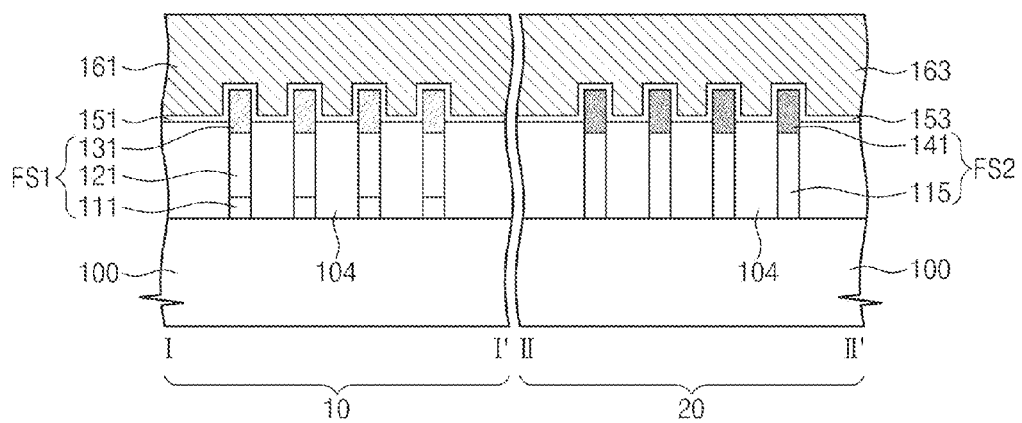
FIG. 2 is a cross-sectional views corresponding to lines I-I' and II-II' of FIG. 1.

FIG. 1 is a plurality of perspective views illustrating semiconductor devices according to some embodiments of the inventive concepts. FIG. 2 is a cross-sectional view corresponding to lines I-I' and II-II' of FIG. 1.

Referring to FIGS. 1 and 2, a semiconductor substrate 100 may include a first region 10 and a second region 20. According to the exemplary embodiment of the inventive concepts, an NMOS fin-type field effect transistor (FinFET) may be formed in the first region 10 and a PMOS fin-type field effect transistor (FinFET) may be formed in the second region 20, respectively, but is not limited thereto.

The semiconductor substrate 100 may be a single-crystal silicon substrate, a silicon-on-insulator (SOI) substrate, a germanium (Ge) substrate, a germanium-on-insulator (GOI) substrate, a silicon-germanium (SiGe) substrate, or a epitaxial layer substrate formed on a base substrate by using a selective epitaxial growth (SEG) process. The semiconductor substrate 100 may also include a III-V group compound semiconductor.

A plurality of first fin structures FS1 may be formed in first region 10 of the semiconductor substrate 100 and a plurality of second fin structures FS2 may be formed in second region 20 of the semiconductor substrate 100, respectively. The plurality of first fin structures FS1 may include a first buffer pattern 111, a second buffer pattern 121, and a first channel pattern 131. The plurality of second fin structures FS2 may include a third buffer pattern 115 and a second channel pattern 141.

An upper surface of the first buffer pattern 111 may have a lower level than an upper surface of the third buffer pattern 115. An upper surface of the second buffer pattern 121 may have the same level as the upper surface of the third buffer pattern 115 from the upper surface of the semiconductor substrate 100. Upper surfaces of the first and second channel patterns 131 and 141 may be coplanar, therefore, the upper surface of the first channel pattern 131 may have substantially the same level as the upper surface of the second channel pattern 141 from the upper surface of the semiconductor substrate 100.

A device isolation pattern 104 may be formed between the first fin structures FS1. The device isolation pattern 104 also may be formed between the second fin structures FS2. An upper surface of the isolation film 104 may have a lower level than the upper surfaces of the first and second channel patterns 131 and 141. A first gate electrode 161 may cross over the first channel pattern 131 of the plurality of first fin structures FS1 in the first region 10. A second gate electrode 163 may cross over the second channel pattern 141 of the plurality of second fin structures FS2 in the second region 20. The first and second gate electrodes 161 and 163 may have a different metal material having different work-functions each other.

A first gate dielectric layer 151 may be formed between the first channel pattern 131 and the first gate electrode 161. A second gate dielectric layer 153 may be formed between the second channel pattern 141 and the second gate electrode 163. The first and second gate dielectric layers 151 and 153 may include a high-k dielectric layer, for example, a hafnium oxide layer, a hafnium silicate layer, a zirconium oxide layer, or zirconium silicate layer.

A first source/drain electrode 171 may be formed at both sides of the first gate electrode 161. A second source/drain electrode 173 may be formed at both sides of the second gate electrode 163. The first and second source/drain electrodes 171 and 173 may include an epitaxial layer. The first source/drain electrode 171 may include a material which can induce a tensile stress or strain to the first channel pattern 131. The second source/drain electrode 173 may include a material which can induce a compressive stress or strain to the second channel pattern 141. For example, the first source/drain electrode 171 may include silicon carbide (SiC) and the second source/drain structure 173 may include silicon germanium (SiGe), but is not limited thereto.

The first buffer pattern 111 of the first fin structures FS1 may have substantially the same lattice structure as the semiconductor substrate 100. However, the first buffer pattern 111 may have a lattice constant greater than that of the semiconductor substrate 100. The lattice constant of the first buffer pattern 111 may be substantially the same over the whole portion of the first buffer pattern 111. The third buffer pattern 115 of the second fin structures FS2 may have a lattice constant greater than the semiconductor substrate 100. Therefore, the first buffer pattern 111 may be formed of the same material as the third buffer pattern 115.

The second buffer pattern 121 may have substantially the same lattice structure as the first buffer pattern 111 at an interface therebetween. However, the lattice constant of the second buffer pattern 121 may be progressively increased from the bottom portion of the second buffer pattern 121 to the upper portion thereof. That is, the lattice constant of the upper portion of the second buffer pattern 121 adjacent the first channel pattern 131 may be greater than that of the bottom portion of the second buffer pattern 121 adjacent the first buffer pattern 111.

For example, the lattice constant of the upper portion of the second buffer pattern 121 may be the same as the lattice constant of the first channel pattern 131 and the lattice constant of the bottom portion of the second buffer pattern 121 may be the same as the lattice constant of the first buffer pattern 111. Therefore, the second buffer pattern 121 may reduce or minimize the lattice mismatch between the first channel pattern 131 and the first buffer pattern 111, and the second buffer pattern 121 also may reduce or minimize the spreading of dislocations from the first buffer pattern 111 to the first channel pattern 131.

In some embodiments, the first channel pattern 131 may have a lattice constant substantially equal to or greater than the upper portion of the second buffer pattern 121. The lattice constant of the first channel pattern 131 may be substantially the same over the whole portion of the first channel pattern 131.

In some embodiments, a difference of the lattice constants between the first channel pattern 131 and an upper portion of the second buffer pattern 121 is less than a difference of lattice constants between the second channel pattern 141 and an upper portion of the third buffer pattern 115.

The second channel pattern 141 may have substantially the same lattice structure as the third buffer pattern 115. However, the second channel pattern 141 may have a lattice constant greater than that of the third buffer pattern 115. The lattice constant of the third buffer pattern 115 may be substantially the same over the whole portion of the third buffer pattern 115. A difference of the lattice constants between the second channel pattern 141 and the third buffer pattern 115 is greater than a difference of lattice constants between the first channel pattern 131 and the second buffer pattern 121. Therefore, compressive or tensile stress or strain may be formed in the second channel pattern 141 by interface adjustments between the second channel pattern 141 and the third buffer pattern 115.

In some embodiments, if the lattice constant of the second channel pattern 141 is greater than that of the third buffer pattern 115, compressive stress or strain may be formed or induced in the second channel pattern 141. The second channel pattern 141 may comprise a semiconductor layer including germanium (Ge). The second channel pattern 141 may be formed by a selective epitaxial growth (SEG) process. The second channel pattern 141 may have uniform germanium (Ge) concentration. The germanium (Ge) concentration of the second channel pattern 141 may be greater than that of the third buffer pattern (115).

The first buffer pattern 111, the second buffer pattern 121, and the first channel pattern 131 of the first fin structures FS1 may comprise a semiconductor material including germanium (Ge), respectively. For example, the first buffer pattern 111 may be a semiconductor layer including germanium (Ge) and may have a uniform concentration of germanium (Ge). The second buffer pattern 121 may be a semiconductor layer including germanium (Ge) and the germanium (Ge) concentration of the second buffer pattern 121 may be progressively increased from the bottom portion of the second buffer pattern 121 to the upper portion thereof. The bottom portion of the second buffer pattern 121 may have substantially the same concentration of germanium (Ge) to the first buffer pattern 111. The upper portion of the second buffer pattern 121 may have substantially the same concentration of germanium (Ge) to the first channel pattern 131. The first channel pattern 131 may have a uniform concentration of germanium (Ge). The first channel pattern 131 may have a germanium (Ge) concentration greater than that of the first buffer pattern 111. The first channel pattern 131 may also have a germanium (Ge) concentration greater than or equal to that of the upper portion of the second buffer pattern 121.

The first through third buffer patterns 111, 121, and 115 may include silicon germanium (SiGe). The first and second channel patterns 131 and 141 may include silicon germanium (SiGe) or germanium (Ge). The germanium (Ge) concentration of the first buffer pattern 111 may be less than that of the second buffer pattern 121. The germanium (Ge) concentration of the first channel pattern 131 may be greater than or equal to that of the upper portion of the second buffer pattern 121. The difference of the germanium (Ge) concentration between the first channel pattern 131 and the upper portion of the second buffer pattern 121 may be up to about 30%.

The first buffer pattern 111 may include $Si_{1-x}Ge_x$ (0<x<1). The second buffer pattern 121 may include $Si_{1-y}Ge_y$ (x≤y≤1), and the germanium (Ge) concentration of the second buffer pattern 121 may be graded, for example, progressively increased from the bottom portion to the upper portion. The first channel pattern 131 may include $Si_{1-a}Ge_a$ (x<a≤1). For example, the germanium (Ge) concentration of the first buffer pattern 111 may have a range of about 10% to about 45%, and the germanium (Ge) concentration of the first channel pattern 131 may have a range of about 70% to about 100%. The germanium (Ge) concentration of the second buffer pattern 121 may have a range of about 30% to about 70%, and the germanium (Ge) concentration of the second buffer pattern 121 may be graded.

The germanium (Ge) concentration of the third buffer pattern 115 may be less than that of the second channel pattern 141. The difference of the germanium (Ge) concentration between the second channel pattern 141 and the third buffer pattern 115 may be greater than or equal to about 30%. The third buffer pattern 115 may include $Si_{1-x}Ge_x$ (0<x<1), and the second channel pattern 141 may include $Si_{1-a}Ge_a$ (x<a≤1). For example, the germanium (Ge) concentration of the second channel pattern 141 may have a range of about 70% to about 100%, and the germanium (Ge) concentration of the third buffer pattern 115 may have a range of about 10% to about 45%.

The germanium (Ge) concentration of the first channel pattern 131 may have substantially the same as that of the second channel pattern 141. For example, the first channel pattern 131 may be formed of strain-relaxed silicon germanium (SiGe) layer, and the second channel pattern 141 may be formed of a strained silicon germanium (SiGe) layer.

In another exemplary embodiment, the first channel pattern 131 may be formed of a strain-relaxed germanium (Ge) layer, and the second channel pattern 141 may be formed of a strained germanium (Ge) layer.

In still another exemplary embodiment, the germanium (Ge) concentration of the first channel pattern 131 may be less than or greater than that of the second channel pattern 141. For example, the first channel pattern 131 may be formed of a strain-relaxed germanium (Ge) layer, and the second channel pattern 141 may be formed of a strained silicon germanium (SiGe) layer. The first channel pattern 131 may be formed of a strain-relaxed silicon germanium (SiGe) layer and the second channel pattern 141 may be formed of a strained germanium (Ge) layer.

The first and second channel patterns 131 and 141 of the first and second fin structures FS1 and FS2 may have upper surfaces 131t and 141t (refer to FIG. 8) which are parallel to the upper surface of the semiconductor substrate 100, respectively, and sidewalls 131s and 141s (refer to FIG. 8) which are substantially perpendicular to the upper surface of the semiconductor substrate 100. The sidewall 131s of the first channel pattern 131 may have a crystal orientation which can increase carrier mobility in the first channel pattern 131. For example, as the current of the fin-type field effect transistor in the first region 10 flows along the sidewall 131s of the first channel pattern 131, the carrier mobility may be more increased in the first channel 131 where strain is relaxed. The sidewall 141s of the second channel pattern 141 also may have a crystal orientation which can increase carrier mobility in the second channel pattern 141. For example, the sidewall 131s of the first channel pattern 131 may have a (110) or (111) crystal orientation. The sidewall 141s of the second channel pattern 141 may have a (110) or (111) crystal orientation. If the first channel pattern 131 is formed of $Si_{1-z}Ge_z(y \le z \le 1)$, the electron mobility may be more increased at the sidewall 131s, which has a (110) or (111) crystal orientation, of the first channel pattern 131 than at the silicon substrate having a (100) crystal orientation. In other words, even though tensile stress or strain is not induced into the first channel pattern 131, the electron mobility may be increased in the first channel pattern 131 having a sidewall of a (110) or (111) crystal orientation.

Figure 3:
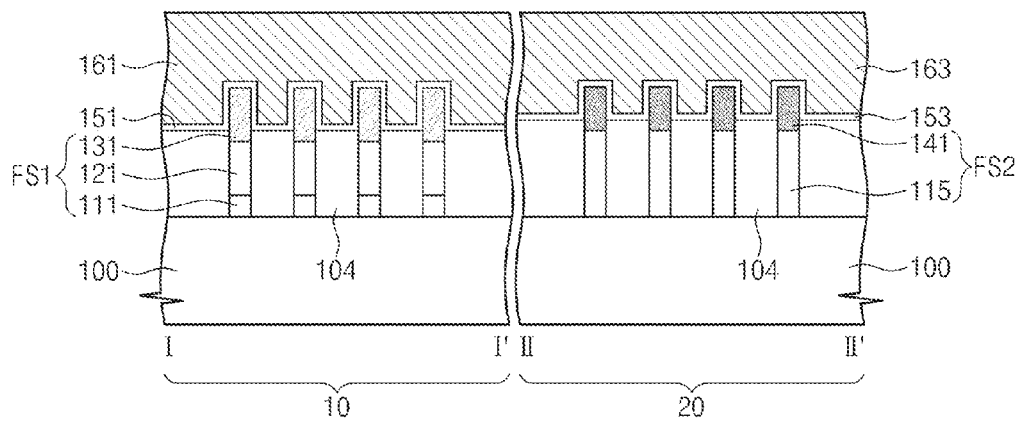
FIGS. 3 through 5 are cross-sectional views illustrating semiconductor devices according to other exemplary embodiments of the inventive concepts and corresponding to lines I-I' and II-II' of FIG. 1.
Figure 4:
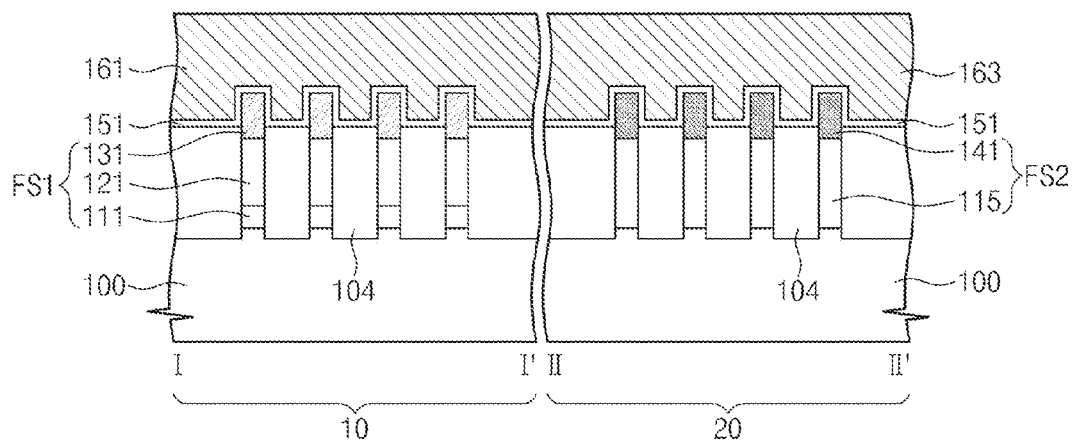
Figure 5:
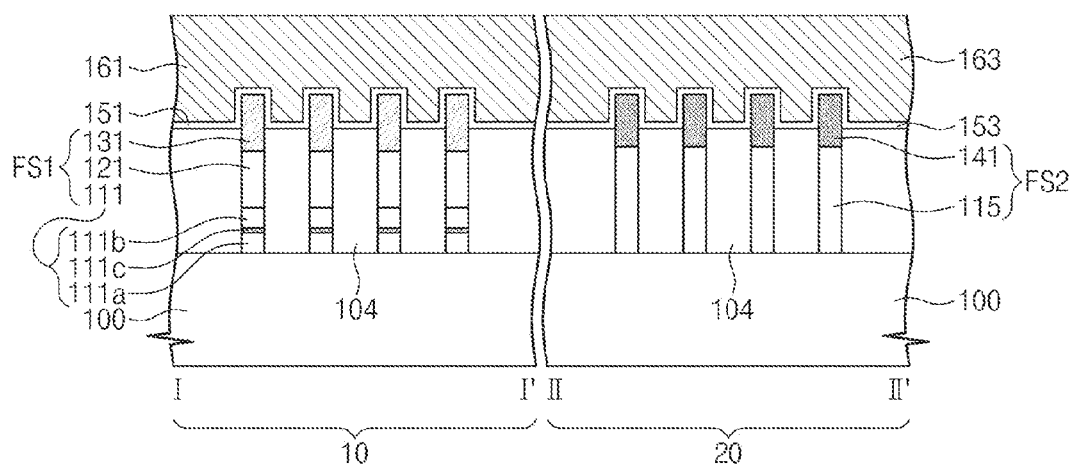

FIGS. 3 through 5 are cross-sectional views illustrating semiconductor devices according to other exemplary embodiments of the inventive concepts and corresponding to lines I-I' and II-II' of FIG. 1.

Referring to FIGS. 1 through 3, a plurality of first fin structures FS1 may be disposed on a semiconductor substrate 100 of a first region 10, a plurality of second fin structures FS2 may be disposed on the semiconductor substrate 100 of a second region 20. The plurality of first fin structures FS1 may include a first buffer pattern 111, a second buffer pattern 121, and a first channel pattern 131. The plurality of second fin structures FS2 may include a third buffer pattern 115 and a second channel pattern 141.

An upper surface of the first buffer pattern 111 and an upper surface of the second buffer pattern 121 may have a lower level than the upper surface of the third buffer pattern 115. An upper surface of the first channel pattern 131 may have the same level as an upper surface of the second channel pattern 141 from an upper surface of the semiconductor substrate 100. The height of the first channel pattern 131 may be greater than the height of the second channel pattern 141.

A device isolation pattern 104 may be formed between the first fin structures FS1. The device isolation pattern 104 also may be formed between the second fin structures FS2. An upper surface of the isolation film 104 disposed in the first region 10 is lower than an upper surface of the isolation film 104 disposed in the second region 20 because the first channel pattern 131, which has a strain-relaxed structure, is formed in the first region 10. Therefore, the effective channel width of the fin-type field effect transistor formed in the first region 10 may be greater than that of the fin-type field effect transistor formed in the second region 20.

Referring to FIG. 4, the upper surface of the semiconductor substrate 100 may be recessed not only at between the first fin structures FS1 in order to have a lower level than the bottom surface of the first buffer pattern 111 but also at between the second fin structures FS2 in order to have a lower level than the bottom surface of the third buffer pattern 115.

Referring to FIGS. 1 and 5, the first fin structures FS1 may be formed on the semiconductor substrate 100 of the first region 10, the second fin structures FS2 may be formed on the semiconductor substrate 100 of the second region 20. The first fin structures FS1 may have the first buffer pattern 111, the second buffer pattern 121, and the first channel pattern 131. The second fin structures FS2 may have a third buffer pattern 115 and the second channel pattern 141. In this exemplary embodiment, the first buffer pattern 111 may include a bottom buffer pattern 111a, an upper buffer pattern 111b, and an etching stop pattern 111c. The lattice constants of the bottom buffer pattern 111a and the upper buffer pattern 111b may be greater than that of the semiconductor substrate 100, but may be less than the first channel pattern 131. The buffer pattern 111a, the upper buffer pattern 111b, the second buffer pattern 121, and the first channel pattern 131 may comprise a semiconductor material including germanium (Ge). The third buffer pattern 115 in the second region 20 may have substantially the same material having same composition as the bottom buffer pattern 111a.

The bottom buffer pattern 111a and the upper buffer pattern 111b may be formed of a same material or a different material. The etching stop pattern 111c may be formed of a different material to the bottom buffer pattern 111a or the upper buffer pattern 111b. For example, if the bottom buffer pattern 111a and the upper buffer pattern 111b comprise silicon germanium (SiGe), the etching stop pattern 111c may comprise silicon germanium carbide (SiGeC) or silicon (Si).

Figure 6:
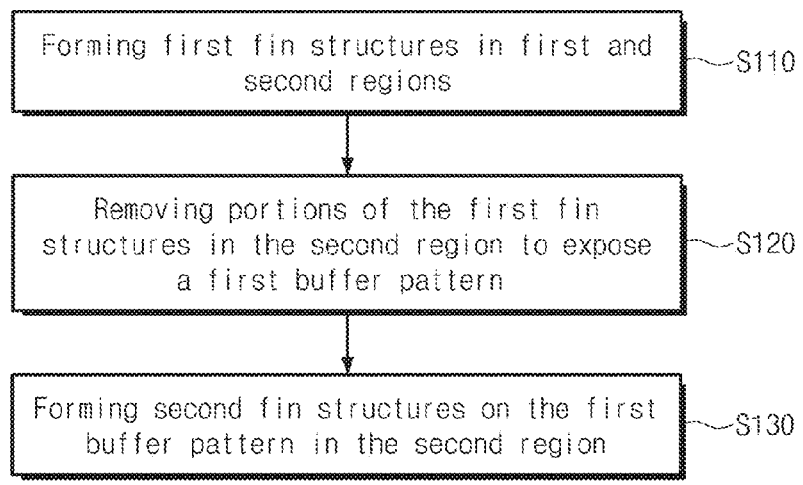
FIG. 6 is a flow chart illustrating methods of manufacturing semiconductor devices according to some embodiments of the inventive concepts.

FIG. 6 is a flow chart illustrating methods of manufacturing semiconductor devices according to some embodiments of the inventive concepts. FIGS. 7a through 7f are cross-sectional views, which are corresponding to lines I-I' and II-II' of FIG. 1, illustrating methods of manufacturing semiconductor devices according to some embodiments of the inventive concepts.

Figure 7A:
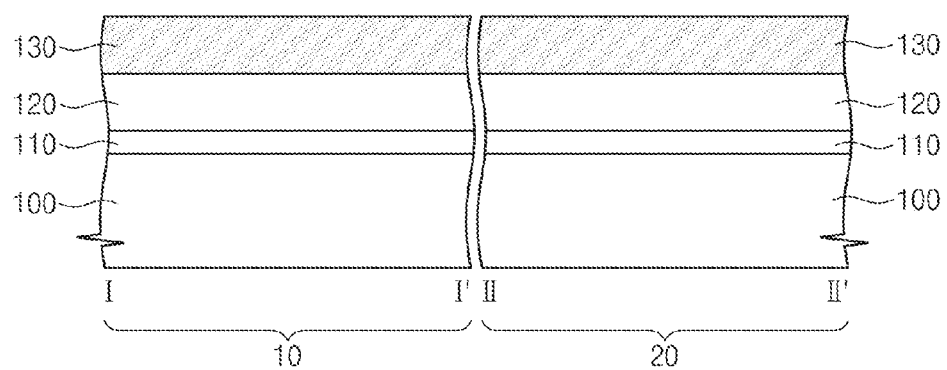
FIGS. 7a through 7f are cross-sectional views, which are corresponding to lines I-I' and II-II' of FIG. 1, illustrating methods of manufacturing semiconductor devices according to some embodiments of the inventive concepts.
Figure 7B:
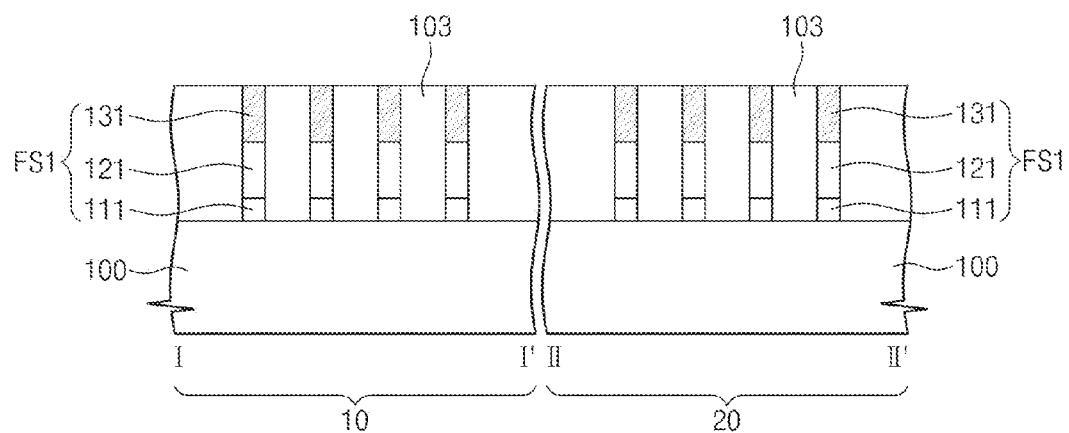

Referring to FIGS. 6, 7a and 7b, a plurality of first fin structures FS1 may be formed on a semiconductor substrate 100 having a first region 10 and a second region 20 (S110). For example, a first buffer layer 110, a second buffer layer 120, and a first channel layer 130 may be sequentially formed on the semiconductor substrate 100.

The semiconductor substrate 100 may be a single-crystal silicon substrate, a silicon-on-insulator (SOI) substrate, a germanium (Ge) substrate, a germanium-on-insulator (GOI) substrate, a silicon-germanium (SiGe) substrate, and/or a epitaxial layer substrate formed on a base substrate by using a selective epitaxial growth (SEG) process. The semiconductor substrate 100 may also include a III-V group compound semiconductor.

The first buffer layer 110 may have substantially the same lattice structure as the semiconductor substrate 100. However, the first buffer layer 110 may have a lattice constant greater than that of the semiconductor substrate 100. The first buffer layer 110 may comprise a semiconductor material including germanium (Ge). If the semiconductor substrate 100 is formed of a single crystal silicon, the first buffer layer 110 may be formed by a selective epitaxial growth (SEG) process using the semiconductor substrate as a seed layer. During the selective epitaxial growth process, germanium (Ge) having a lattice constant greater than that of silicon (Si) may be injected into the first buffer layer 110. The entirety of the first buffer layer 110 may have a uniform germanium concentration. The selective epitaxial growth process may be performed by using a chemical vapor deposition (CVD)

process or a molecular beam epitaxy (MBE) process. The first buffer layer 110 may be formed of $Si_{1-x}Ge_x$ (0<x<1) and the germanium concentration of the first buffer layer 110 may have a range of from about 10% to about 45%.

The second buffer layer 120 may have substantially the same lattice structure as the first buffer layer 110. However, the lattice constant of the second buffer pattern 120 may be progressively increased from the bottom portion of the second buffer pattern 120 to the upper portion thereof. The second buffer layer 120 may comprise a semiconductor material including germanium (Ge). The second buffer layer 120 may be formed by a selective epitaxial growth (SEG) process using the semiconductor substrate as a seed layer. During the selective epitaxial growth process, germanium (Ge) having a lattice constant greater than that of silicon (Si) may be injected into the second buffer layer 120. The germanium (Ge) concentration which is injected into the second buffer layer 120 may be progressively increased during the SEG process. The second buffer layer 120 may be formed of graded $Si_{1-y}Ge_y$ (x≤y≤1) and the germanium concentration of the second buffer layer 120 may have grading range of from about 30% to about 70%. For example, the lattice constant of the upper portion of the second buffer pattern 120 may be the same as the lattice constant of the first channel layer 130 and the lattice constant of the bottom portion of the second buffer layer 120 may be the same as the lattice constant of the first buffer layer 110. Therefore, the second buffer layer 120 may reduce or minimize the lattice mismatch between the first channel layer 130 and the first buffer layer 110. The second buffer layer 120 also may reduce or minimize the spreading of dislocations from the first buffer layer 110 to the first channel layer 130.

The first channel layer 130 may be formed of a semiconductor material having a lattice constant equal to or greater than that of the upper portion of the second buffer layer 120. The lattice constant of the first channel layer 130 may be constant in the whole portion thereof. In other words, the first channel layer 130 may have a uniform lattice constant. The first channel layer 130 may be formed by an epitaxial growth process using the second buffer layer 120 as a seed layer. During the epitaxial growth process, germanium (Ge) may be injected into the first channel layer 130. The first channel layer may be formed of $Si_{1-z}Ge_z$ (y≤z≤1) and the germanium concentration of the first channel layer 130 may have a range of from about 70% to about 100%.

Referring to FIG. 7b, a plurality of first fin structures FS1 may be formed in the first and second regions 10 and 20 of the substrate 100. The method of forming the plurality of first fin structures FS1 may include forming a mask pattern on the first channel layer 120 and patterning the first buffer layer 110, the second buffer layer 120, and the first channel layer 130 by performing an anisotropic etching process using the mask pattern as an etch mask. A portion of an upper surface of the semiconductor substrate 100 may be exposed after the anisotropic etching process. In another exemplary embodiment, the exposed upper surface of the semiconductor substrate 100 may be recessed as shown in FIG. 4.

The plurality of first fin structure FS1 may include a first buffer pattern 111, a second buffer pattern 121, and a first channel pattern 131. The plurality of first fin structures may be equally spaced apart.

A device isolation layer 103 may be formed between the first fin structures FS1. The method of forming the device isolation layer 103 may include forming an insulating layer filling the spaces between the first fin structures FS1 on the semiconductor substrate 100, and planarizing the insulating layer to expose an upper surface of the first channel pattern 131. The device isolation layer 103 may comprise a boron-phosphorous silicate glass (BPSG) film, a high density plasma (HDP) film, an undoped silicate glass (USG) film, and/or a tonen silazene (TOSZ) film.

Figure 7C:
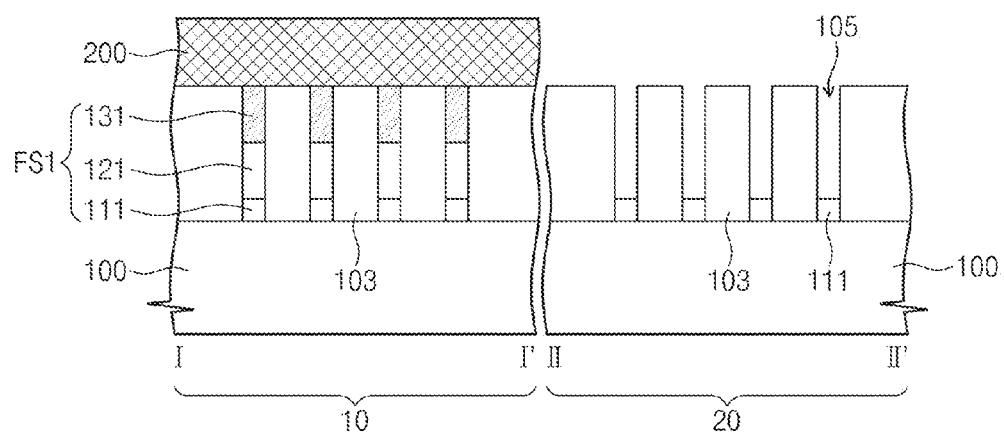

Referring to FIGS. 6 and 7c, a portion of the first fin structures FS1 formed in the second region 20 may be partially and selectively removed to expose the first buffer pattern 111 (S120). Specifically, a mask pattern 200 may be formed on the first fin structures FS1 in the first region 10. The mask pattern 200 may expose upper surfaces of the first fin structures FS1 formed in the second region 20. After the upper portions of the first fin structures FS1 are removed in the second region 20, a plurality of trenches 105 may be formed in the device isolation layer 103. For example, the first channel pattern 131 and the second buffer pattern 121 may be etched and the first buffer pattern 111 may be exposed in the trenches 105. An upper surface of the first buffer pattern 111 formed in the second region 20 may be lower than the upper surface of the first buffer pattern 111 formed in the first region 10.

Figure 7D:
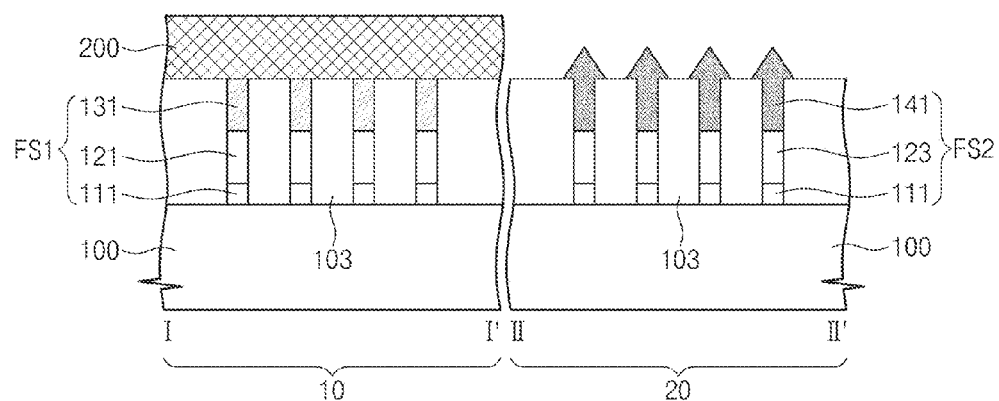
Figure 7E:
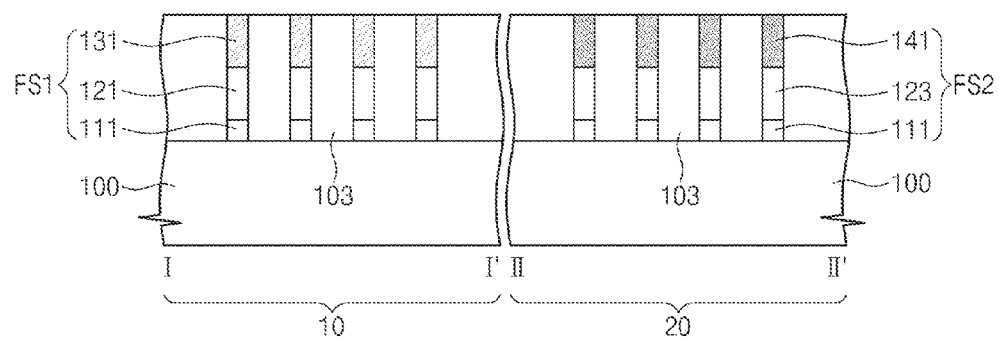

Referring to FIGS. 6, 7d and 7e, a plurality of second fin structures FS2 may be formed on the first buffer pattern 111 in the second region 20 (S130). Specifically, referring to FIG. 7d, a third buffer pattern 123 may be formed in the trenches. The trenches are partially filled by the third buffer pattern 123 by performing a selective epitaxial growth process using the first buffer pattern 111 as a seed layer. The upper surface of the third buffer pattern may be lower than the device isolation layer 103. The third buffer pattern 123 may be formed of substantially the same material as the first buffer pattern 111. Therefore, the third buffer pattern 123 may have substantially same lattice structure and have a uniform lattice constant in the whole portion thereof. For example, the third buffer pattern 123 may be formed of a semiconductor material including germanium (Ge) and the germanium concentration may be uniform throughout the third buffer pattern 123.

In some embodiments, the third buffer pattern 123 may include silicon germanium (SiGe) and may be formed of substantially the same material as the first buffer pattern 111. For example, the third buffer pattern 123 may be formed of $Si_{1-x}Ge_x$ (0<x<1). The germanium (Ge) concentration of the third buffer pattern may have a range of from about 0% to about 45%.

Subsequently, a second channel pattern 141 may be formed on the third buffer pattern 123. The second channel pattern 141 may be formed by performing a selective epitaxial growth process using the third buffer pattern as a seed layer. The trenches 105 may be completely filled by the second channel pattern 141 and an upper surface of the second channel pattern 141 may be higher than the upper surface of the device isolation layer 103.

The second channel pattern 141 may be formed of a semiconductor material having a higher lattice constant than that of the third buffer pattern 123. The second channel pattern 141 may include silicon germanium (SiGe) and have a uniform germanium concentration throughout the second channel pattern 141. The germanium concentration of the second channel pattern 141 may be greater than that of the third buffer pattern 123.

In some embodiments, as the second channel pattern 141 is formed on the third buffer pattern with an interface adjustment by using the selective epitaxial growth process, compressive stress or strain may be induced into the second channel pattern 141 because the lattice constant of the second channel pattern 141 is greater than that of the third buffer pattern 123.

The second channel pattern 141 may include silicon germanium (SiGe) or germanium (Ge). The germanium (Ge) concentration of the second channel pattern 141 may be greater than that of the third buffer pattern 123. The germanium (Ge) concentration of the second channel pattern may have a range of from about 75% to about 100%. The difference of germanium concentrations between the second channel pattern 141 and the third buffer pattern 123 may be greater than or equal to about 30%. The third buffer pattern 123 may be formed of $Si_{1-x}Ge_x$ (0<x<1) and the second channel pattern 141 may be formed of $Si_{1-a}Ge_a$ (x<a≤1). In some embodiments, the third buffer pattern 123 may be formed of $Si_{1-x}Ge_x$ (0<x<1) and the second buffer pattern may be formed of germanium (Ge). The mask pattern (200) of the first region 10 may be removed after the formation of the second channel pattern 141.

Referring to FIG. 7e, an upper portion of the second channel pattern 141 protruding from the upper surface of the device isolation layer 103 may be planarized by using a planarization process in the second region 20. After the planarization process, upper surfaces of the first channel pattern 131, the second channel pattern 141, and the device isolation layer 103 may be coplanar.

Figure 7F:
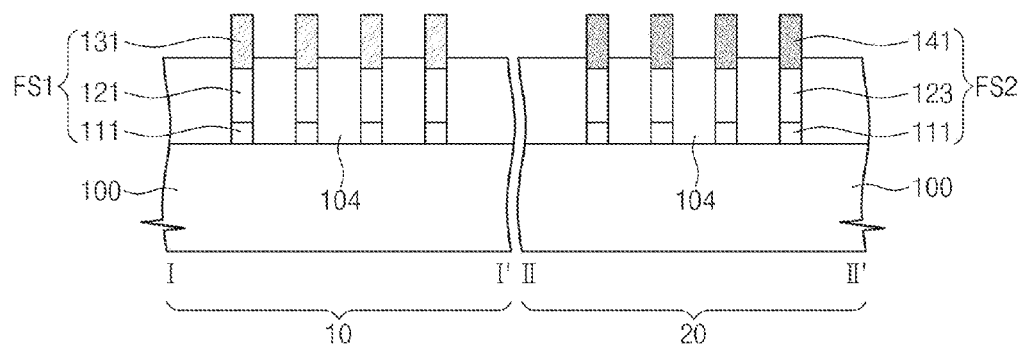

Referring to FIG. 7f, sidewalls of the first and second channel patterns 131 and 141 may be exposed by recessing an upper portion of the device isolation layer 103 in the first and second regions 10 and 20. A device isolation pattern 104 may be formed between the first and second channel patterns 131 and 141. An upper surface of the device isolation pattern 104 may be higher than the bottom surfaces of the first and second channel patterns 131 and 141.

In some embodiments, the upper surface of the device isolation pattern 104 of the first region 10 may have substantially the same level (i.e., may be coplanar with) as the upper surface of the device isolation pattern 104 of the second region 20. In another exemplary embodiment, the upper surfaces of the device isolation pattern 104 of the first and second regions 10 and 20 may be different from (i.e., non-coplanar with) each other, for example, the upper surface of the device isolation pattern 104 of the first region 10 may be lower than that of the second region 20.

Figure 8:
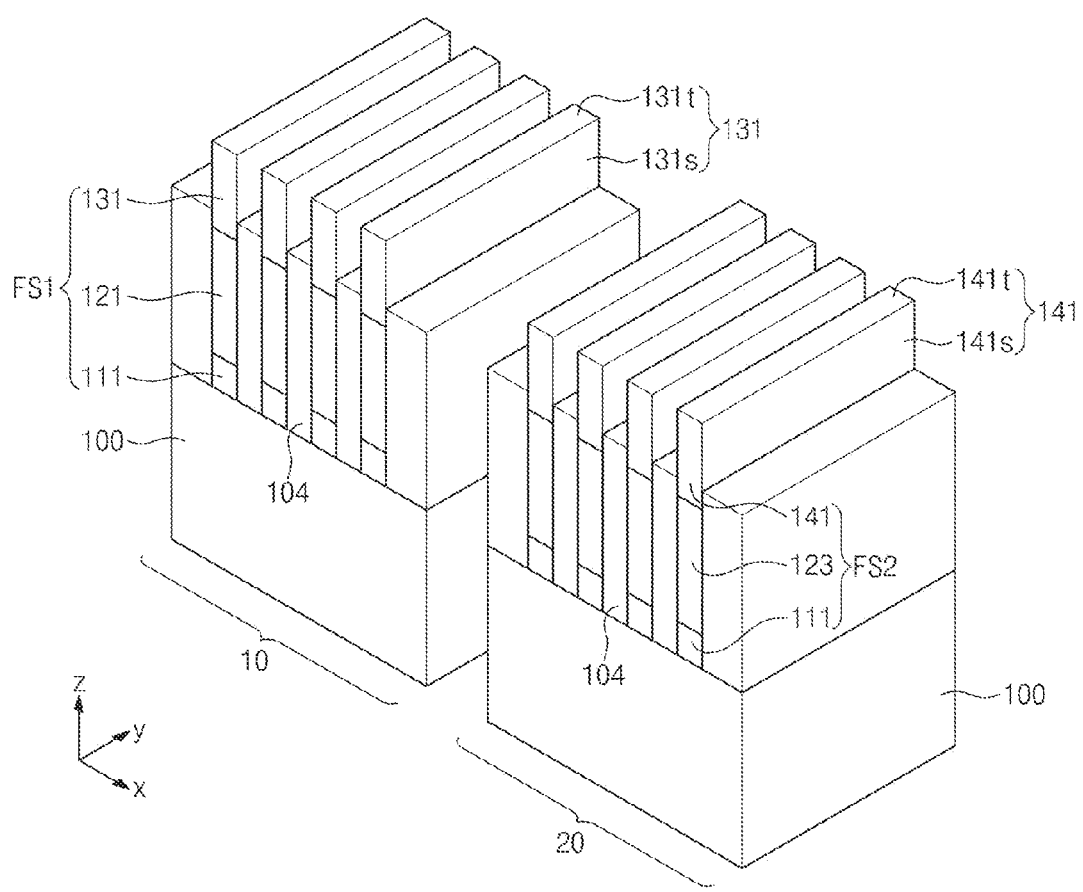
FIG. 8 is a perspective view illustrating a first fin structure and a second fin structure manufactured according to some embodiments of the inventive concepts.

FIG. 8 is a perspective view illustrating a first fin structure and a second fin structure manufactured according to some embodiments of the inventive concepts.

Referring to FIG. 8, the first and second channel patterns 131 and 141 may have upper surfaces 131t and 141t which are parallel to the upper surface of the semiconductor substrate 100 and sidewalls 131s and 141s which are substantially perpendicular to the semiconductor substrate 100. The sidewalls of the first and second channel patterns 131s and 141s may be formed by a selective epitaxial growth (SEG) process and may have a (110) or (111) crystal orientation.

Referring to FIGS. 1 and 2 again, a first gate dielectric layer 151 and a first gate electrode 161 may be formed on the first channel pattern 131 and a second gate dielectric layer 153 and a second gate electrode 163 may be formed on the second channel pattern 141.

The first and second gate dielectric layers 151 and 153 may include a high-k dielectric layer, for example, a hafnium oxide layer, a hafnium silicate layer, a zirconium oxide layer, and/or zirconium silicate layer. The first and second gate electrodes 161 and 163 may include a metal material having different work-function from each other. The first and second gate electrodes 161 and 163 may include a barrier metal layer and a metal layer. For example, the barrier metal layer may include titanium nitride, tantalum nitride, tungsten nitride, hafnium nitride, and/or zirconium nitride. The metal layer may include tungsten, copper, hafnium, zirconium, titanium, tantalum, aluminum, ruthenium, palladium, platinum, cobalt, nickel, and/or conductive metal nitride.

A first source/drain electrode 171 may be formed at both sides of the first gate electrode 161 and a second source/drain electrode 173 may be formed at both sides of the second gate electrode 163 as shown in FIG. 1.

In some embodiments, the method of forming the first source/drain electrode 171 may include removing a portion of the first channel pattern 131 formed at both sides of the first gate electrode 161 and forming an epitaxial layer at both sides of the first gate electrode 161. The first source/drain electrode 171 may include a material which may form or induce a tensile strain in the first channel pattern 131. That is, the first source/drain electrode 171 may be formed of a semiconductor material having a lattice constant less than that of the first channel pattern 131. The method of forming the second source/drain electrode 173 may include removing a portion of the second channel pattern 141 formed at both sides of the second gate electrode 163 and forming an epitaxial layer at both sides of the second gate electrode 163. The second source/drain electrode 173 may include a material which may form or induce a compressive strain in the second channel pattern 141. That is, the second source/drain electrode 173 may be formed of a semiconductor material having a lattice constant greater than that of the second channel pattern 141.

In some embodiments, the method of forming the first and second source/drain electrode 171 and 173 may include injecting N-type or P-type impurities into the first and second channel patterns 131 and 141 by performing an ion implantation process using the first and second gate electrodes 171 and 173 as masks.

FIGS. 9a through 9d are cross-sectional views, which are corresponding to lines I-I' and II-II' of FIG. 1, illustrating methods of manufacturing semiconductor devices according to another exemplary embodiment of the inventive concepts.

Figure 9A:
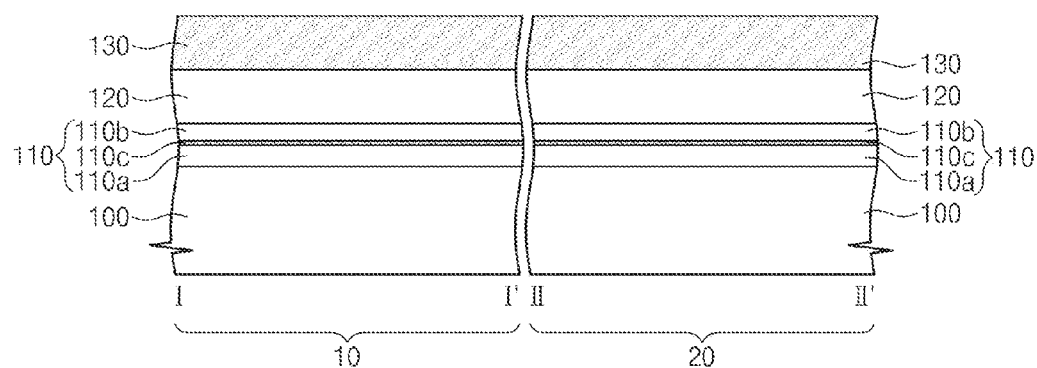
FIGS. 9a through 9c are cross-sectional views, which are corresponding to lines I-I' and II-II' of FIG. 1, illustrating methods of manufacturing semiconductor devices according to another exemplary embodiment of the inventive concepts.

Referring to FIG. 9a, a first buffer layer 110, a second buffer layer 120, and a first channel layer 130 may be sequentially formed on a semiconductor substrate 100 having a first region 10 and a second region 20. The first buffer layer 110 may include a lower buffer layer 110a, an etch stop layer 110c, and an upper buffer layer 110b. The lower buffer layer 110a and the upper buffer layer 110b may have a lattice constant greater than that of the semiconductor substrate 100. The upper buffer layer 110b may have a lattice constant substantially equal to that of the bottom portion of the second channel layer 120. In some embodiments, the lower buffer layer 110a and the upper buffer layer 110a may be formed of substantially the same or different materials each other.

The lower buffer layer 110a and the upper buffer layer 110b may include silicon germanium (SiGe). For example, the lower buffer layer 110a may be formed of silicon germanium (SiGe) and the upper buffer layer 110b may be formed of silicon germanium carbon (SiGeC) or silicon (Si).

Figure 9B:
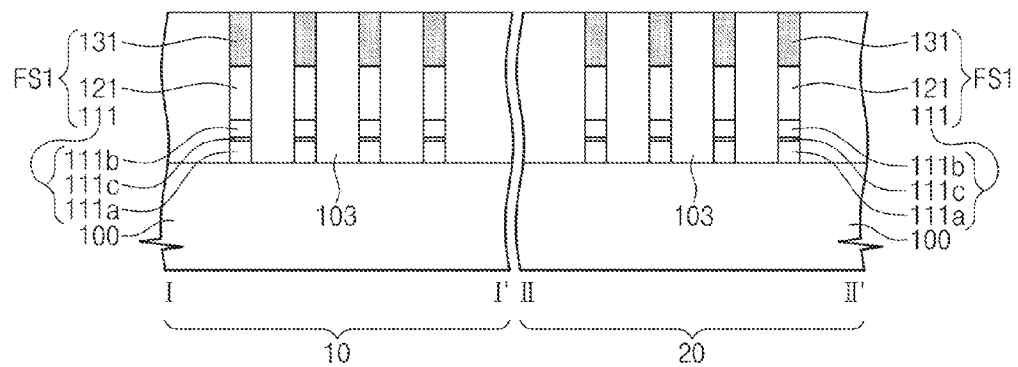

Referring to FIG. 9b, a plurality of first fin structure FS1 may be formed in the first and second region by patterning the first buffer layer 110, the second buffer layer 120, and the first channel layer 130. The first fin structures FS1 may include a first buffer pattern 111, a second buffer pattern 121, and a first channel pattern 131 which are sequentially stacked on the semiconductor substrate 100. The first buffer pattern 111 may include a lower buffer pattern 111a, a etch stop pattern 111c, and an upper buffer pattern 111b. A device isolation layer 103 may be formed between the first fin structures FS1 after forming the plurality of first fin structures FS1.

Figure 9C:
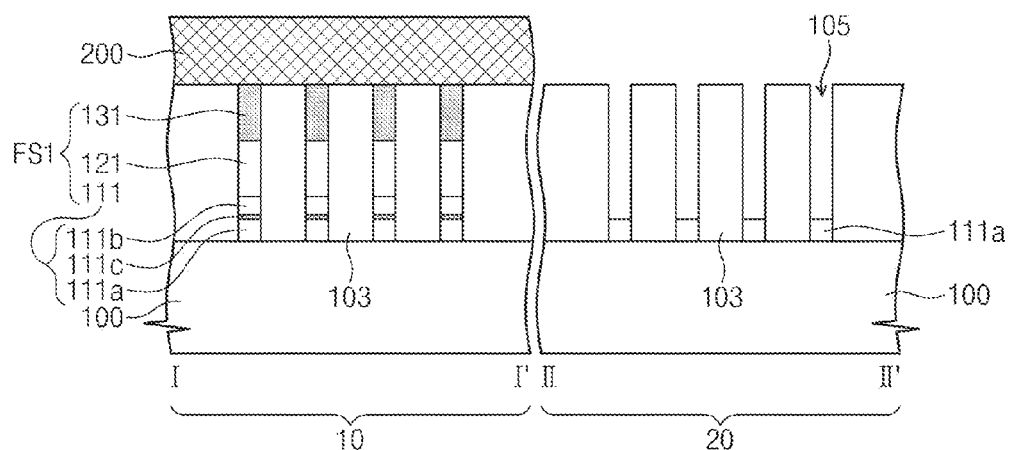

Referring to FIG. 9c, the lower buffer pattern 111a of the first buffer pattern may be exposed in the second region 20 by removing an upper portion of the first fin structures FS1 which are formed in the second region 20. Specifically, a mask pattern 200 may be formed on the first fin structures FS1 in the first region 10. The mask pattern 200 may expose upper surfaces of the first fin structures FS1 formed in the second region 20. After the upper portions of the first fin structures FS1 are removed in the second region 20, a plurality of trenches 105 may be formed in the device isolation layer 103. The method of removing the upper portion of the first fin structures FS1 may include sequentially removing the first channel pattern 131, the second channel pattern 121, and the upper buffer pattern 111b which are formed in the first region 20. At this moment, the etch stop pattern 111c may act as an etch stop layer. The etch stop pattern 111c may be removed and an upper surface of the lower buffer pattern 111a may be exposed.

A third buffer pattern 123 and a second channel pattern 141 may be formed on the lower buffer pattern 111a as shown FIGS. 7d and 7e.

Figure 10:
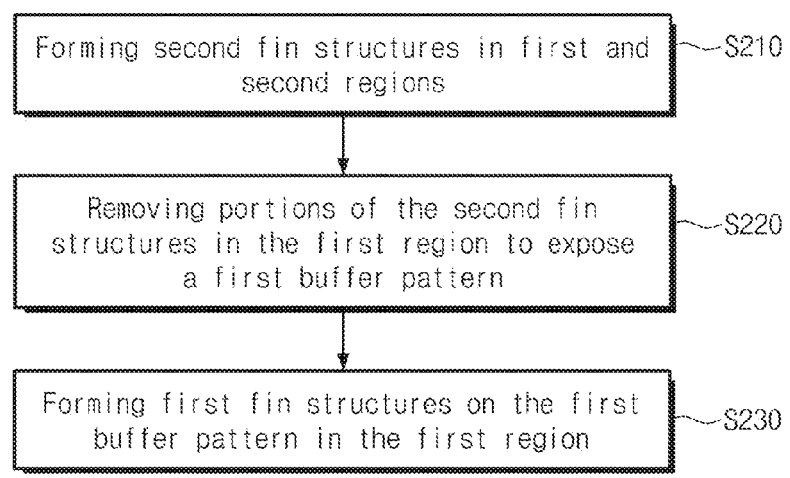
FIG. 10 is a flow chart illustrating methods of manufacturing semiconductor devices according to another exemplary embodiment of the inventive concepts.

FIG. 10 is a flow chart illustrating methods of manufacturing semiconductor devices according to another exemplary embodiment of the inventive concepts. FIGS. 11a through 11f are cross-sectional views, which are corresponding to lines I-I' and II-II' of FIG. 1, illustrating methods of manufacturing semiconductor devices according to still another exemplary embodiment of the inventive concepts.

In some embodiments, the plurality of second fin structures FS1 may be formed after the plurality of the second fin structures FS2.

Figure 11A:
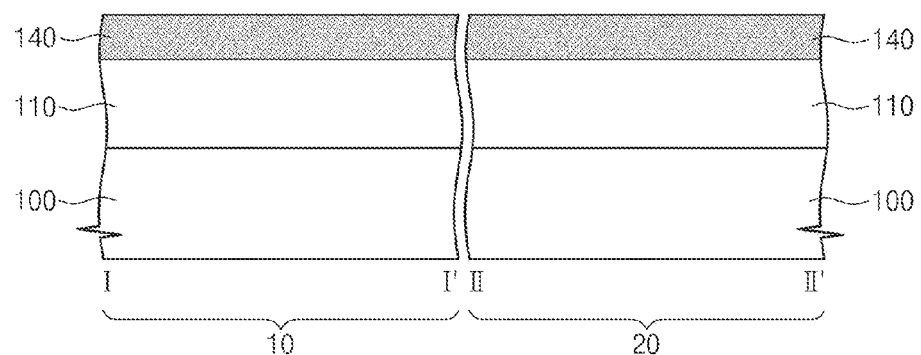
FIGS. 11a through 11f are cross-sectional views, which are corresponding to lines I-I' and II-II' of FIG. 1, illustrating methods of manufacturing semiconductor devices according to still another exemplary embodiment of the inventive concepts.
Figure 11B:
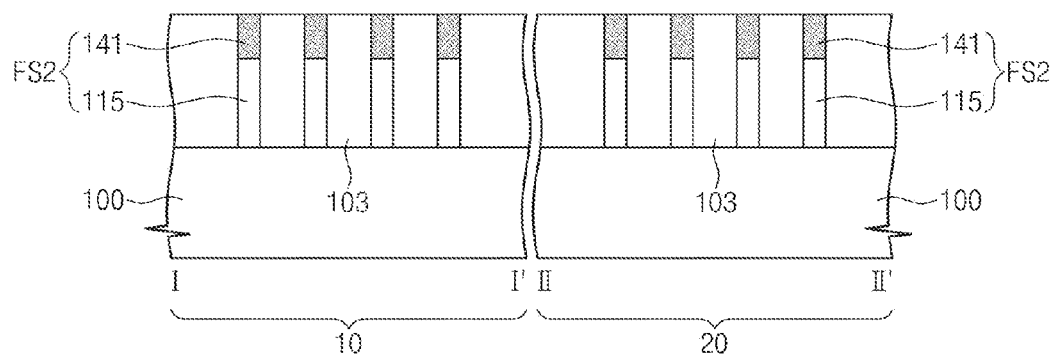

Referring to FIGS. 10, 11a and 11b, a plurality of second fin structures FS2 may be formed on a semiconductor substrate 100 having a first region 10 and a second region 20 (S210). Specifically, a first buffer layer 110 and a second channel layer 140 may be sequentially formed on the semiconductor substrate 100. The first buffer layer 110 may be thicker than the first buffer layer 110 which is shown in FIG. 7a.

The first buffer layer 110 may have substantially same lattice structure as the semiconductor substrate 100. However, the first buffer layer 110 may have a lattice constant greater than that of the semiconductor substrate 100.

The first buffer layer 110 may comprise a semiconductor material including germanium (Ge). If the semiconductor substrate 100 is formed of a single crystal silicon layer, the first buffer layer 110 may be formed by an epitaxial growth process using the semiconductor substrate 100 as a seed layer. Germanium (Ge) having a lattice constant greater than that of silicon (Si) may be doped into the first buffer layer 110 during the epitaxial growth process. The first buffer layer 110 may have a substantially uniform germanium (Ge) concentration. The first buffer layer 110 may be formed of $Si_{1-x}Ge_x$ (0<x<1). The germanium concentration may have a range of from about 10% to about 45% in the first buffer layer 110.

The second channel layer 140 may be formed of a semiconductor material having a lattice constant greater than that of the first buffer layer 110. The second channel layer 140 may have a substantially uniform lattice constant. The second channel layer 140 may include germanium (Ge). The second channel layer 140 may be formed by an epitaxial growth process using the first buffer layer 140 as a seed layer and germanium (Ge) may be doped into the second channel layer 140 during the epitaxial growth process. The germanium (Ge) concentration in the second channel layer 140 may be greater than in the first buffer layer 110.

In some embodiments, a compressive strain may be induced to the second channel layer 140 by an interface adjustment because the second channel layer 140 is formed on the first buffer layer 110 having a lower lattice constant than that of the second channel layer 140.

The second channel layer 140 may include silicon germanium (SiGe) or germanium (Ge). The germanium (Ge) concentration of the second channel layer 140 may be greater than that of the first buffer layer 110. The germanium (Ge) concentration may have a range of from about 75% to about 100%. The difference of germanium (Ge) concentrations between the second channel layer 140 and the first buffer layer 110 may be greater than or equal to about 30%. The first buffer layer 110 may be formed of $Si_{1-x}Ge_x$ (0<x<1) and the second channel layer 140 may be formed of $Si_{1-a}Ge_a$ (x<a≤1). In some embodiments, the first buffer layer 110 may be formed of $Si_{1-x}Ge_x$ (0<x<1) and the second channel layer may be formed of germanium (Ge).

Referring to FIG. 11b, a plurality of second fin structures FS2 may be formed on the semiconductor substrate 100 having the first and second regions 10 and 20. The method of forming the second fin structures FS2 may include forming a mask pattern on the second channel layer 140 and performing an anisotropic etching to the first buffer layer 110 and the second channel layer 140. An upper surface of the semiconductor substrate 100 may be exposed by patterning the first buffer layer 110 and the second channel layer 140. A second channel pattern 141 may be formed by patterning the second channel layer 140 and a third buffer pattern 115 may be formed by patterning the first buffer layer 110 formed in the second region 20. Therefore the second fin structures FS2 formed in the second region 20 may include the second channel pattern 141 and the third buffer pattern 115.

A device isolation layer 103 may be formed between the second fin structures FS2. The method of forming the device isolation layer 103 may include depositing an insulating layer between the second fin structures FS2 and planarizing the insulating layer to expose an upper surface of the second channel patterns 141.

Figure 11C:
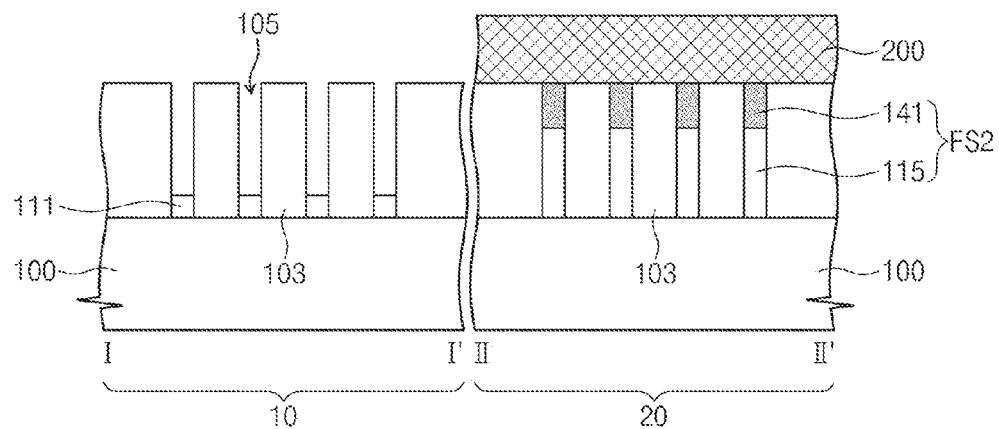

Referring to FIGS. 10 and 11c, the first buffer pattern 111 may be formed in the first region 10 by removing an upper portion of the second fin structures FS2 (S220). Specifically, a mask pattern 200 may be formed on the second fin structures FS2 in the second region 20. The mask pattern 200 may expose an upper surface of the second fin structures FS2 in the first region 10. A plurality of trenches 105 may be formed by removing upper portions of the second fin structures FS2. The upper surface of the first buffer pattern 111 may be exposed in the trenches 105 by removing the second channel pattern 141 and an upper portion of the third buffer pattern 115 which are formed in the first region 10. Therefore, the upper surface of the first buffer pattern 111 formed in the first region 10 may be lower than the upper surface of the third buffer pattern 115 formed in the second region 20.

Figure 11D:
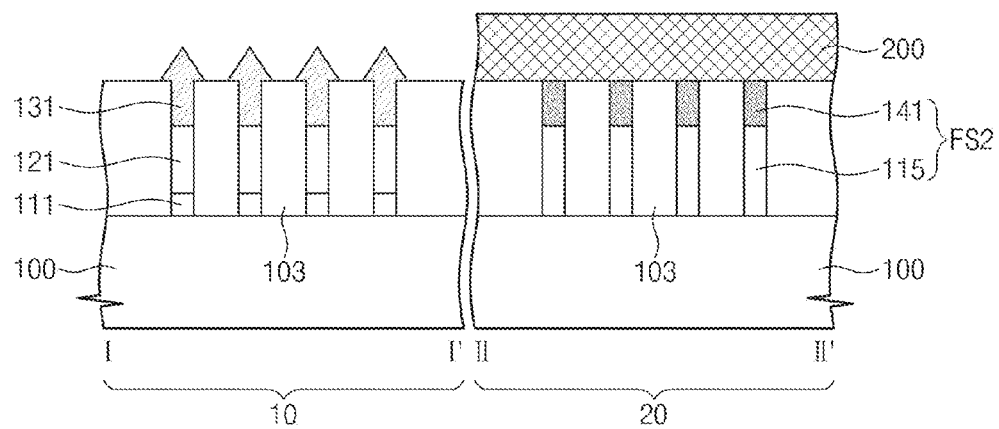
Figure 11E:
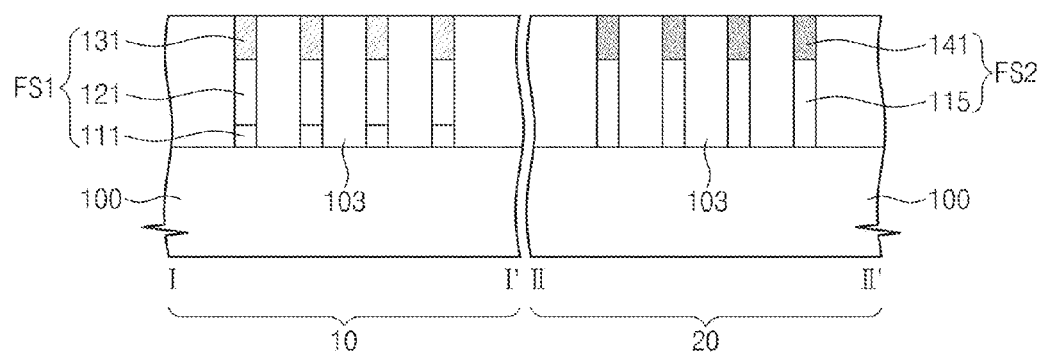

Referring to FIGS. 10, 11d and 11e, a plurality of first fin structures FS1 may be formed on the first buffer pattern 111 in the first region 10 (S230).

Specifically, a second buffer pattern 121 and a first channel pattern 131 may be sequentially formed on the first buffer pattern 111 in the trenches 105 as shown in FIG. 11d. The second buffer pattern 121 may be formed by a selective epitaxial growth process using the first buffer pattern 111 as a seed layer. The upper surface of the second buffer pattern 121 may be lower than the upper surface of the device isolation layer 103.

Germanium (Ge) may be doped to the second buffer pattern 121 during the selective epitaxial growth process. The germanium (Ge) concentration doped to the second buffer pattern 121 may be progressively increased during the selective epitaxial growth process. Therefore, the germanium (Ge) concentration of the second buffer pattern 121 may be progressively increased from the bottom portion to the upper portion. The lattice constant of the second buffer pattern 121 may be increased from the bottom portion to the upper portion because the lattice constant of germanium (Ge) is greater than silicon (Si). The second buffer pattern 121 may be formed of graded $Si_{1-y}Ge_y$ ($x \le y \le 1$) and the germanium (Ge) concentration of the second buffer pattern 121 may have a range of from about 30% to about 70%.

Referring to FIG. 11d, a first channel pattern 131 may be formed on the second buffer pattern 121 in the trenches 105. The first channel pattern 131 may be formed by a selective epitaxial growth process using the second buffer pattern 121 as a seed layer. The first channel pattern 131 may completely fill the trenches 105 and an upper surface of the first channel pattern 131 may be higher than the upper surface of the device isolation layer 103. The first channel pattern 131 may have substantially the same lattice constant as the upper portion of the second buffer pattern 121. In some embodiments, the first channel pattern 131 may have a lattice constant greater than that of the second buffer pattern 121. The first channel pattern may have a substantially uniform lattice constant.

Referring to FIG. 11e, the mask pattern 200 formed in the second region 20 may be removed after forming the first channel pattern 131. The upper surface of the first channel pattern 131 may be planarized by performing a planarization process, for example, a chemical mechanical polishing (CMP) process. Therefore, the upper surfaces of the first channel pattern 131, the second channel 141 and the device isolation layer 103 may be coplanar.

Figure 11F:
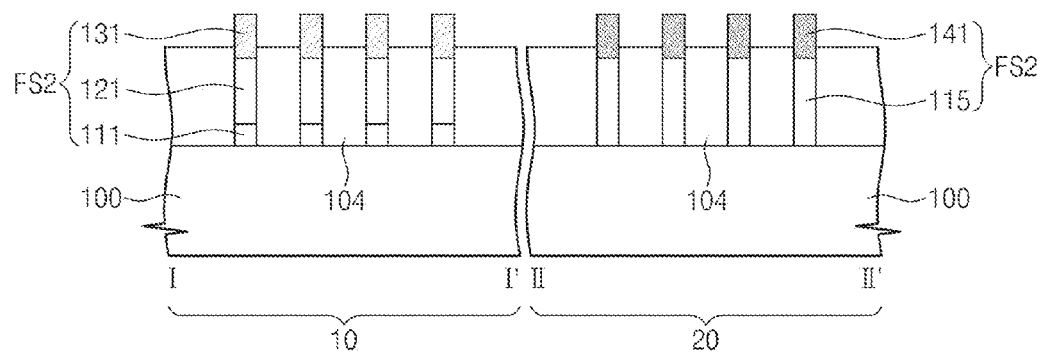

Referring to FIG. 11f, an upper portion of the device isolation layer 103 may be recessed to expose sidewalls of the first and second channel patterns 131 and 141 in the first and second region s 10 and 20. A device isolation pattern 104 may be formed between the first channel pattern 131 and the second channel pattern 141 after recessing the device isolation layer 103.

Subsequently, as shown in FIGS. 1 and 2, a first gate dielectric layer 151 and a first gate electrode 161 crossing over the first channel pattern 131 may be formed in the first region 10, and a second gate dielectric layer 153 and a first gate electrode 163 crossing over the second channel pattern 141 may be formed in the second region 20. A first source/drain electrode 171 may be formed at both sides of the first gate electrode 161 and a second source/drain electrode 173 may be formed at both sides of the second gate electrode 163.

Figure 12:
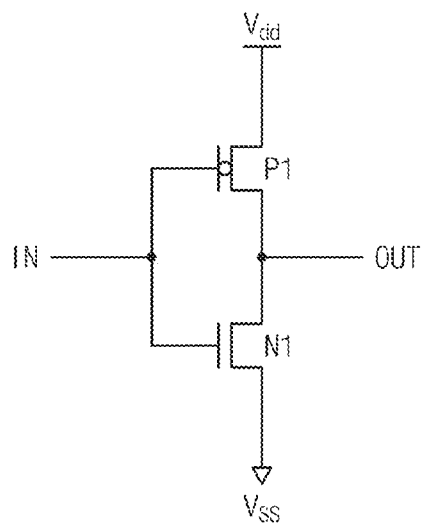
FIG. 12 is a circuit diagram of an inverter according to some embodiments of the inventive concepts.

FIG. 12 is a circuit diagram of an inverter according to some embodiments of the inventive concepts.

Referring to FIG. 12, a complementary metal-oxide-semiconductor (CMOS) inverter may include a PMOS transistor P1 and an NMOS transistor N1. The PMOS and NMOS transistors may be directly connected to each other at between a driving voltage Vdd and a ground voltage Vss and an input signal IN may be commonly input to gate electrodes of the PMOS and NMOS transistors P1 and N1. An output signal may be commonly output from the drains of the PMOS and NMOS transistors P1 and N1. A driving voltage Vdd may be supplied to the source of the PMOS transistor P1 and a ground voltage Vss may be applied to the source of the NMOS transistor N1. The CMOS inverter may output the output signal inverted relative to the input signal. Specifically, if the input signal is data of high level, the CMOS inverter may output data of low level, and if the input signal is data of low level, the CMOS inverter may output data of high level.

Figure 13:
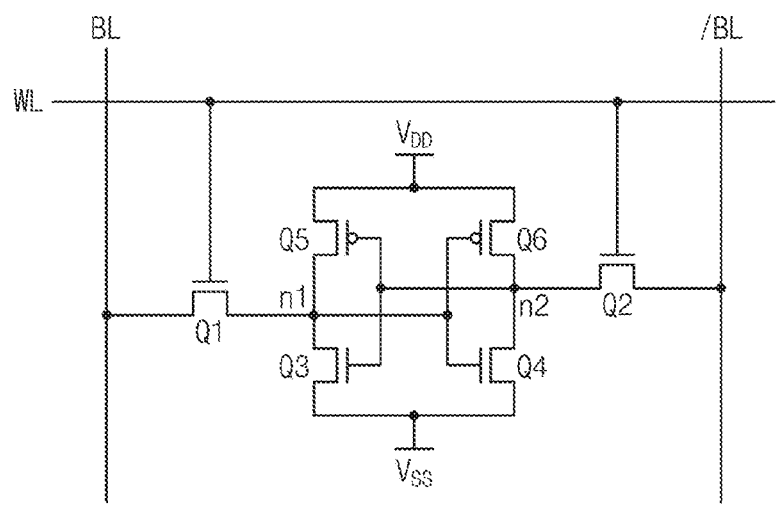
FIG. 13 is a circuit diagram of a SRAM (Static Random Access Memory) device according to some embodiments of the inventive concepts.

FIG. 13 is a circuit diagram of a SRAM (Static Random Access Memory) device according to some embodiments of the inventive concepts.

Referring to FIG. 13, the CMOS SRAM cell may include a pair of driver transistors, e.g., a first driver transistor Q3 and a second driver transistor Q4, a pair of transfer transistors, e.g., a first transfer transistor Q1 and a second transfer transistor Q2, and a pair of load transistors, e.g., a first load transistor Q5 and a second load transistor Q6. The first and second driver transistors Q3 and Q4 may be pull-down transistors. The first and second transfer transistors Q1 and Q2 may be pass transistors. The first and second load transistors Q5 and Q6 may be pull-up transistors. The first and second driver transistors Q3 and Q4 and the first and second transfer transistors Q1 and Q2 may be formed of a NMOS transistor, respectively. The first and second load transistors Q5 and Q6 may be formed of a PMOS transistor, respectively. The field effect transistors according to example embodiments of the inventive concepts may be applied to the driver transistors, the transfer transistors, and/or the load transistors.

The first driver transistor Q3 and the first transfer transistor Q1 may be connected in series to each other. A source region of the first driver transistor Q3 may be electrically connected to a ground line Vss and a drain region of the first transfer transistor Q1 may be electrically connected to a bit line BL. The second driver transistor Q4 and the second transfer transistor Q2 may be connected in series to each other. A source region of the second driver transistor Q4 may be electrically connected to a ground line Vss and a drain region of the second transfer transistor Q2 may be electrically connected to a bit line/BL.

The drain region of the first load transistor Q5 may be electrically connected to a power supply line VDD. The source region of the first load transistor Q5 may be electrically connected to the drain region of the driver transistor Q3. The drain region of the second load transistor Q6 may be electrically connected to the power supply line VDD. The source region of the first load transistor Q5 may be electrically connected to the drain region of the driver transistor Q4. A first node n1 may include the drain region of the first load transistor Q5, the drain region of the first driver transistor Q3, and the source region of the first transfer transistor Q1. A second node n2 may include the drain region of the second load transistor Q6, the drain region of the second driver transistor Q4, and the source region of the second transfer transistor Q2. The gate electrode of the first driver transistor Q3 and the gate electrode of the first load transistor Q5 may be electrically connected to the second node n2. The gate electrode of the second driver transistor Q4 and the gate electrode of the second load transistor Q6 may be electrically connected to the first node n1. The gate electrodes of the first and second transfer transistors Q1 and Q2 may be electrically connected to a word line WL. A first half H1 cell may comprise the first driver transistor Q3, the first transfer transistor Q1, and the first load transistor Q5. A second half cell H2 may comprise the second driver transistor Q4, the second transfer transistor Q2, and the second load transistor Q6. The present inventive concepts may be applied to not only SRAM devices but also DRAM (Dynamic Random Access Memory) or MRAM (Magnetic Random Access Memory) devices.

Figure 14:
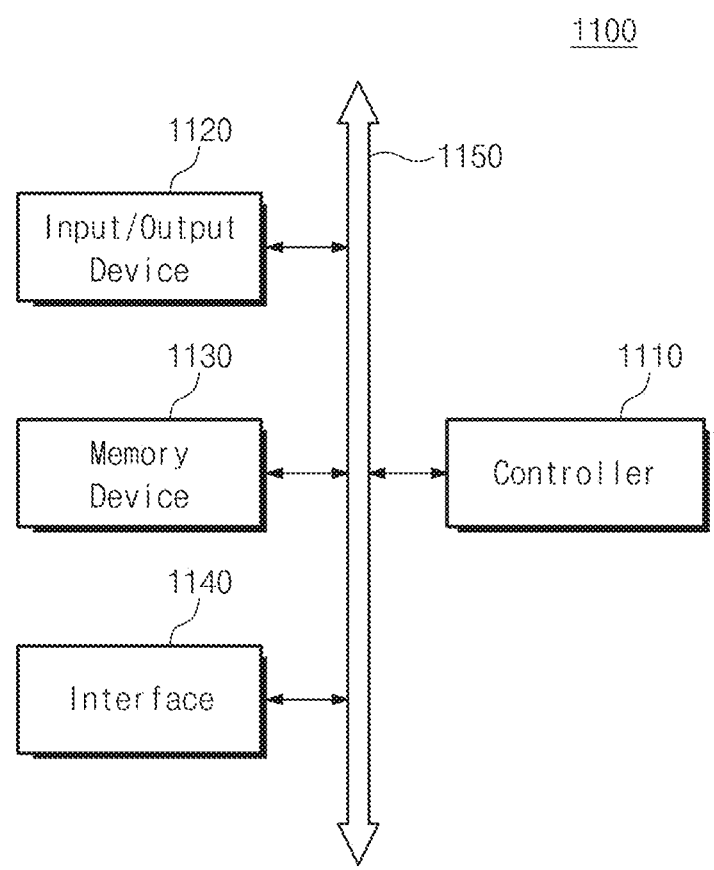
FIG. 14 is a block diagram of an electronic system including semiconductor devices according to some embodiments of the inventive concepts.

FIG. 14 is a block diagram of an electronic system including semiconductor devices according to some embodiments of the inventive concepts.

Referring to FIG. 14, the system 1100 may comprise a controller 1110, an input/output device 1120, a memory device 1130, an interface 1140, and a bus 1150. The controller 1110, the input/output device 1120, the memory device 1130, and the interface 1140 may communicate with each other through the bus 1150. The bus 1150 may correspond to a path over which data can be transferred between system elements.

The controller 1110 may comprise a microprocessor, a digital signal processor, a microcontroller, or a similar device that can control an executive program. The input/output device 1120 may comprise a keypad, a keyboard, or a display. The memory device 1130 may not only save codes or data for executing the controller 1110 but also save data executed by the controller 1110. The memory device 1130 may comprise a semiconductor device, which has an NMOS and/or PMOS transistor, according to embodiments of the inventive concepts.

The system 1100 may be applied to a product that can transport information, e.g., a PDA (personal digital assistant), a portable computer, a web tablet, a wireless phone, a mobile phone, a digital music player, and/or a memory card.

The above-disclosed subject matter is to be considered illustrative and not restrictive, and the appended claims are intended to cover all such modifications, enhancements, and other embodiments, which fall within the true spirit and scope of the inventive concepts. Thus, the scope of the inventive concepts is to be determined by the broadest permissible interpretation of the following claims and their equivalents, and shall not be restricted or limited by the foregoing detailed description.

What is claimed is:

1. A method of manufacturing a semiconductor device, the method comprising:
    providing a substrate having a first region and a second region;
    forming a plurality of first fin structures on the substrate, the plurality of first fin structures including a first buffer pattern and a first channel pattern;
    forming a device isolation pattern filling a plurality of gaps between the plurality of first fin structures;
    forming a plurality of trenches in the device isolation pattern formed in the second region by removing upper portions of the first fin structures, the plurality of trenches exposing the first buffer pattern formed in the second region; and
    forming a plurality of second fin structures on the first buffer pattern formed in the second region, the plurality of second fin structures including a second buffer pattern and a second channel pattern,
    wherein the first and second buffer patterns and the first and second channel patterns comprise a semiconductor material including germanium (Ge).

2. The method of claim 1, wherein an upper surface of the first buffer pattern formed in the second region has a lower level than an upper surface of the first buffer pattern formed in the first region.

3. The method of claim 1, wherein the plurality of first fin structures further comprises a third buffer pattern between the first buffer pattern and the first channel pattern, the third buffer pattern comprising semiconductor material including germanium (Ge), and
    wherein a germanium (Ge) concentration of the third buffer pattern progressively increases from a bottom portion of the third buffer pattern to an upper portion of the third buffer pattern.

4. The method of claim 3, wherein a difference of the germanium (Ge) concentrations between the first channel pattern and an upper portion of the third buffer pattern is less than a difference of the germanium (Ge) concentrations between the second channel pattern and an upper portion of the second buffer pattern.

5. The method of claim 1, wherein a germanium (Ge) concentration of the second buffer pattern progressively increases from a bottom portion of the second buffer pattern to an upper portion of the second buffer pattern.

6. The method of claim 5, wherein a difference of the germanium (Ge) concentrations between the second channel pattern and an upper portion of the second buffer pattern is less than a difference of the germanium (Ge) concentrations between the first channel pattern and an upper portion of the first buffer pattern.

* * * * *